US008748279B2

(12) United States Patent
Jiang et al.

(10) Patent No.: US 8,748,279 B2
(45) Date of Patent: Jun. 10, 2014

(54) METHOD OF MANUFACTURING A SEMICONDUCTOR DEVICE

(75) Inventors: Li Jiang, Beijing (CN); Mingqi Li, Beijing (CN)

(73) Assignee: Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 13/323,489

(22) Filed: Dec. 12, 2011

(65) Prior Publication Data
US 2013/0045581 A1 Feb. 21, 2013

(30) Foreign Application Priority Data
Aug. 16, 2011 (CN) .......................... 2011 1 0235045

(51) Int. Cl.
H01L 21/336 (2006.01)
H01L 21/00 (2006.01)

(52) U.S. Cl.
USPC ................... 438/296; 438/294; 257/E21.001

(58) Field of Classification Search
USPC .................................................. 438/689–697
See application file for complete search history.

(56) References Cited

U.S. PATENT DOCUMENTS

| | | | | |
|---|---|---|---|---|
| 5,750,434 A * | 5/1998 | Urushidani et al. | ........... | 438/478 |
| 5,933,748 A * | 8/1999 | Chou et al. | ..................... | 438/431 |
| 5,960,270 A * | 9/1999 | Misra et al. | .................... | 438/197 |
| 6,010,942 A * | 1/2000 | Chien et al. | ................... | 438/396 |
| 6,046,088 A * | 4/2000 | Klein et al. | .................... | 438/296 |
| 6,146,970 A * | 11/2000 | Witek et al. | .................... | 438/424 |
| 6,261,953 B1 * | 7/2001 | Uozumi | ........................ | 438/687 |
| 6,372,699 B1 * | 4/2002 | Morita et al. | ................. | 510/175 |
| 6,391,793 B2 * | 5/2002 | Lee et al. | ........................ | 438/745 |
| 6,432,815 B2 * | 8/2002 | Yokoi | .......................... | 438/627 |
| 6,475,072 B1 * | 11/2002 | Canaperi et al. | ................ | 451/65 |
| 6,498,383 B2 * | 12/2002 | Beyer et al. | .................... | 257/510 |
| 6,596,630 B2 * | 7/2003 | Yokoi | .......................... | 438/648 |
| 6,699,766 B1 * | 3/2004 | Taravade et al. | ............. | 438/381 |
| 6,863,592 B2 * | 3/2005 | Lee et al. | ......................... | 451/36 |
| 6,866,792 B2 * | 3/2005 | Small et al. | .................. | 252/79.1 |
| 7,104,869 B2 * | 9/2006 | Tsai et al. | ....................... | 451/41 |
| 7,105,475 B2 * | 9/2006 | Kim et al. | ..................... | 510/176 |
| 7,148,146 B1 * | 12/2006 | Taravade et al. | ............. | 438/692 |
| 7,432,186 B2 * | 10/2008 | Nishiura et al. | ............. | 438/604 |
| 7,449,413 B1 * | 11/2008 | Achuthan et al. | ............ | 438/692 |
| 7,531,105 B2 * | 5/2009 | Dysard et al. | ................ | 252/79.1 |
| 7,867,059 B2 * | 1/2011 | Pietsch et al. | ..................... | 451/11 |
| 8,043,435 B2 * | 10/2011 | Haibara et al. | ................. | 134/1.3 |
| 8,273,610 B2 * | 9/2012 | Or-Bach et al. | .............. | 438/142 |
| 8,357,311 B2 * | 1/2013 | Shirota et al. | ................ | 252/79.1 |
| 8,440,094 B1 * | 5/2013 | Guo et al. | ........................ | 216/89 |
| 2002/0037654 A1 * | 3/2002 | Hayashi et al. | .............. | 438/745 |
| 2007/0254484 A1 * | 11/2007 | Feng et al. | ..................... | 438/692 |
| 2008/0160256 A1 * | 7/2008 | Bristol et al. | ................. | 428/143 |
| 2008/0261399 A1 * | 10/2008 | Choi et al. | ..................... | 438/692 |

(Continued)

Primary Examiner — Seahvosh Nikmanesh
Assistant Examiner — Evren Seven
(74) Attorney, Agent, or Firm — Koppel, Patrick, Heybl & Philpott

(57) ABSTRACT

The present invention discloses a method of manufacturing semiconductor devices. The method includes a step of performing a chemical mechanical planarization processing on a poly-silicon layer before fabricating a poly-silicon gate such that the poly-silicon gates obtained in subsequent fabrication process are kept at the same height, which thus avoids the silicon nitride residues issue that occurs in the prior art. Therefore, the present invention is capable of enhancing product yield of semiconductor devices and improving device performances.

16 Claims, 6 Drawing Sheets

(56) References Cited

U.S. PATENT DOCUMENTS

| | | | |
|---|---|---|---|
| 2009/0215267 A1* | 8/2009 | Shibata et al. | 438/692 |
| 2011/0146565 A1* | 6/2011 | Ishibashi et al. | 117/54 |
| 2012/0094489 A1* | 4/2012 | Moeggenborg et al. | 438/692 |
| 2012/0264304 A1* | 10/2012 | Ward | 438/693 |
| 2013/0109194 A1* | 5/2013 | Shirota et al. | 438/759 |
| 2013/0273739 A1* | 10/2013 | Raman et al. | 438/692 |

* cited by examiner

METHOD OF MANUFACTURING A SEMICONDUCTOR DEVICE

CROSS-REFERENCE TO RELATED APPLICATIONS

This application claims priority to Chinese Patent Application No. 201110235045.3, filed on Aug. 16, 2011 and entitled "Method of Manufacturing a Semiconductor Device", which is incorporated in its entirety herein by reference.

BACKGROUND OF THE INVENTION

1. Field of the Invention

The present invention relates to a method of manufacturing a semiconductor device, and more particularly, relates to an improved method of manufacturing a semiconductor device to form a gate.

2. Description of the Related Art

With the rapid development of the semiconductor industry, critical dimensions of semiconductors have been continuously shrunk. Requirements for gate height and topography control has become stricter. During the fabrication process of a semiconductor device, chemical mechanical planarization (CMP) processing needs to be performed on the device several times. Currently, as part of the latest fabrication process, high dielectric constant metal gate (i.e. high-K metal gate) gradually becomes a main stream. Generally, the high-K metal gate is fabricated by employing a "dummy gate" procedure. During the fabrication process of such a semiconductor device, first, a poly-silicon is employed to occupy a gate's position (i.e. so called "dummy gate"). Then, source and drain implantations are performed, and finally, the poly-silicon gate is replaced by a metal, thereby forming a real metal gate.

FIG. 1 and FIG. 2 are diagrams showing a structure of a prior art semiconductor device. As shown in the figures, after forming, a shallow trench isolation, a gate oxide is formed on a semiconductor substrate 102 and a poly-silicon layer is deposited on the gate oxide, and then a first poly-silicon gate 103, a second poly-silicon gate 104 and a third poly-silicon gate 105 are formed directly by etching the poly-silicon layer. However, since the surface of an insulator (e.g. silicon oxide) filled in the shallow trench isolation trench is typically higher or lower than the surface of the semiconductor substrate 102 (for example, the surface of a first insulator 101 is higher than the surface of the semiconductor substrate 102 and the surface of a second insulator 107 is lower than the surface of the semiconductor substrate 102), the surface of the poly-silicon layer that is formed directly by deposition is not planar. As a result, the first poly-silicon gate 103, the second poly-silicon gate 104 and the third poly-silicon gate 105 formed in such way have different heights. Hereinto, the first poly-silicon gate 103 is higher than the surrounding second poly-silicon gate 104 because the first poly-silicon gate 103 is located on the first insulator 101; the third poly-silicon gate 105 is lower than the surrounding second poly-silicon gate 104 because the third poly-silicon gate 105 is located on the second insulator 107.

During the subsequent ILD0 (interlayer dielectric) chemical mechanical planarization processing, the CMP processing needs to be performed on high aspect ratio process (HARP) material 108 (which is usually an oxide), silicon nitride 106 (SiN) and poly-silicon on a silicon substrate at the same time. However, due to height differences among each gate, the CMP processing fails to completely remove the silicon nitride 106 that covers the top of all the poly-silicon gates, which results in residues of silicon nitride 106. In FIG. 1, the first poly-silicon gate 103 is higher than the surrounding second poly-silicon gate 104, and thus, during the CMP processing, when removing the silicon nitride from an upper surface of the first poly-silicon gate 103 to expose the upper surface of the first poly-silicon gate 103, the silicon nitride on an upper surface of the second poly-silicon gate 104 is not completely removed, and a portion thereof remains. In addition, in FIG. 2, the third poly-silicon gate 105 is lower than the surrounding second poly-silicon gate 104, and thus, during the CMP processing, when removing the silicon nitride on the upper surface of the second poly-silicon gate 104 to expose the upper surface of the second poly-silicon gate 104, the nitride silicon on an upper surface of the third poly-silicon gate 105 is not completely removed, and a portion remains.

In one example, the surface of the silicon oxide in shallow isolation trench is lower than the surface of the substrate. As a result, after ILD0 CMP, there is silicon nitride remaining between the regular linear gates.

SUMMARY

The inventor of the present invention has found that there are problems in the prior art and thus proposes a new technical solution to address at least one of the problems.

An object of the present invention is to provide a method of manufacturing a semiconductor device.

According to a first aspect of the present invention, there is provided a method of manufacturing a semiconductor device, comprising forming an isolation trench on a semiconductor substrate, depositing a layer of an insulating material in the semiconductor substrate, removing the insulating material from a surface of the semiconductor substrate, with the insulating material being left in the isolation trench, forming a gate oxide on the semiconductor substrate, depositing a poly-silicon layer on said gate oxide, performing a chemical mechanical planarization processing on said poly-silicon layer, such that a surface of said poly-silicon layer becomes planar, and forming a poly-silicon gate with said poly-silicon layer.

Preferably, the method of manufacturing a semiconductor device further comprises a step of forming a protection layer before the formation of said isolation trench.

Further, said protection layer comprises a first protection layer and a second protection layer on said first protection layer.

Further, the protection layer is made of silicon oxide and the second protection layer is made of silicon nitride.

Preferably, the insulating material is an oxide or an oxynitride. The oxide is preferably silicon oxide and the oxynitride is preferably silicon oxynitride.

Preferably, in the case when said poly-silicon gate is a dummy gate, the method of manufacturing a semiconductor device further comprises a step of replacing the poly-silicon gate with a metal, and thus forming a metal gate after the formation of the poly-silicon gate.

Further, the metal is aluminium or tungsten.

Preferably, the isolation trench is a shallow isolation trench.

Preferably, the method of manufacturing a semiconductor device further comprises a step of forming an active area in the substrate by ion implantation.

Preferably, the method of manufacturing a semiconductor device further comprises a step of cleaning the surface of the poly-silicon layer after the poly-silicon layer has been subjected to the chemical mechanical planarization processing.

Further, the step of cleaning comprises cleaning the surface of the poly-silicon layer using an alkaline solution having a temperature higher than 60° C., to remove particles remaining on the surface of the poly-silicon layer.

Further, the particles are $CeO_2$.

Further, the alkaline solution has a pH value from 6.8 to 9.8.

Further, the alkaline solution is a mixed solution of ammonia solution, hydrogen peroxide solution, and de-ionized water.

Further, a volume ratio for the ammonia solution, the hydrogen peroxide solution and the de-ionized water is 1:1:40-1:3:100. The volume ratio is preferably 1:2:50. Generally, the ammonia solution has a mass concentration of 29% and the hydrogen peroxide solution has a mass concentration of 30%.

Preferably, the method of manufacturing a semiconductor device further comprises performing ultrasonic processing on the surface of the poly-silicon layer while cleaning.

Further, the ultrasonic processing has a power ranging from 80 W to 500 W.

Further, the ultrasonic processing has a frequency ranging from 20 KHz to 100 KHz.

An advantage of the present invention is the ability to address silicon nitride residues that occur during ILD0 chemical mechanical planarization processing.

Further features of the present invention and advantages thereof will become apparent from the following detailed description of exemplary embodiments according to the present invention with reference to the accompanying drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

The present invention will become apparent based on the following description with reference to the drawings.

DESCRIPTION OF THE EMBODIMENTS

Figure 1:
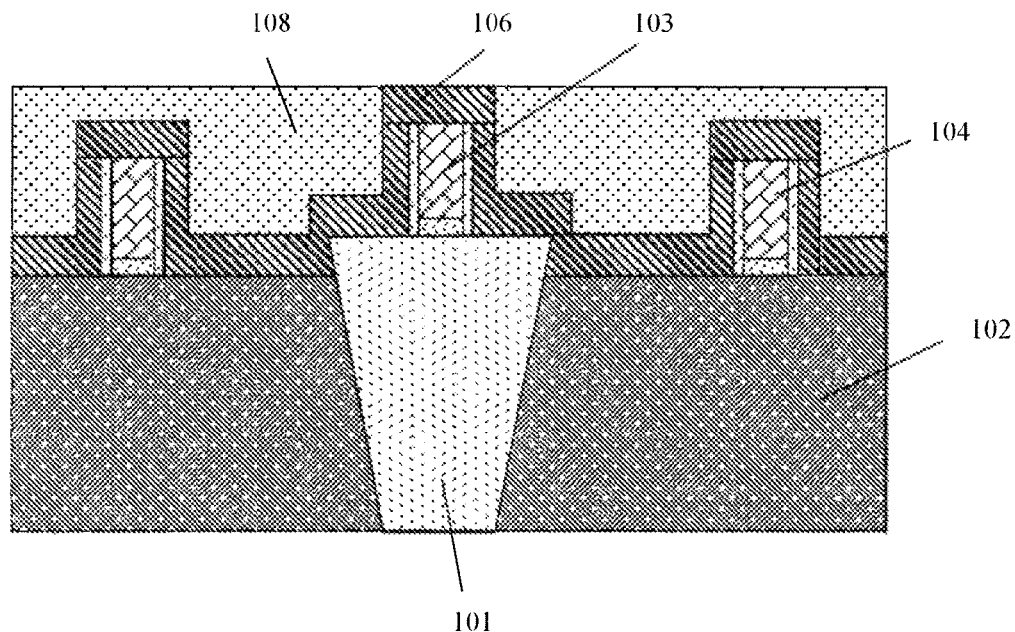
FIG. 1 is a diagram showing a structure of a prior art semiconductor device.
Figure 2:
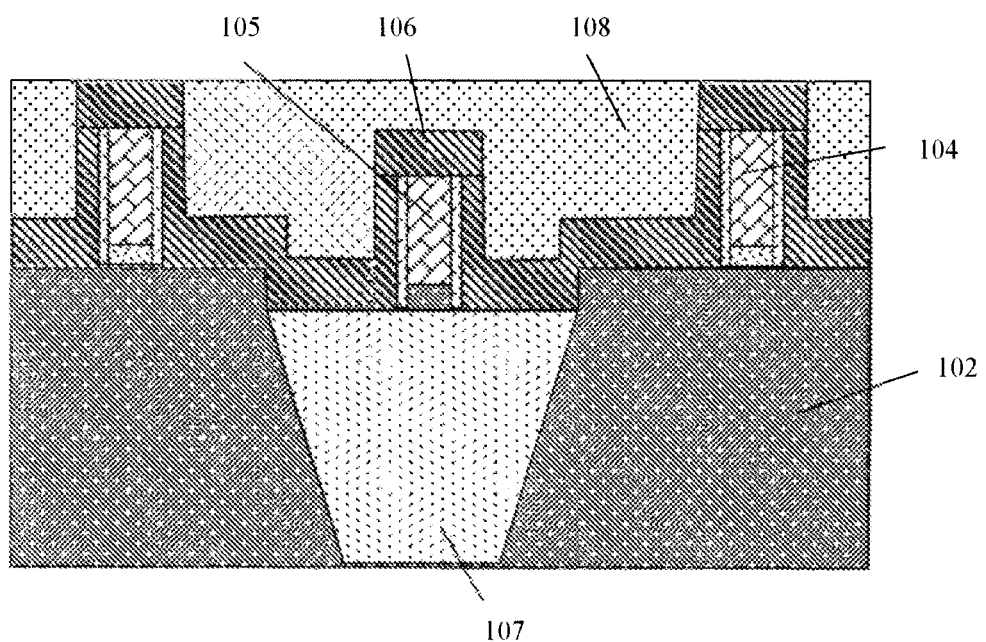
FIG. 2 is a diagram showing a structure of a prior art semiconductor device.

Various exemplary embodiments of the present invention will now be described in detail with reference to the drawings. It should be noted that the relative arrangement of the components and steps, the numerical expressions, and numerical values set forth in the embodiment do not limit the scope of the present invention unless it is specifically stated otherwise.

It should also be understood that, for the convenience of description, each component shown in the figures has not necessarily been drawn to scale.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Similar reference numerals and letters refer to similar items in the following figures, and thus once an item is defined in one figure, it is possible that it is not further discussed for following figures.

Figure 3:
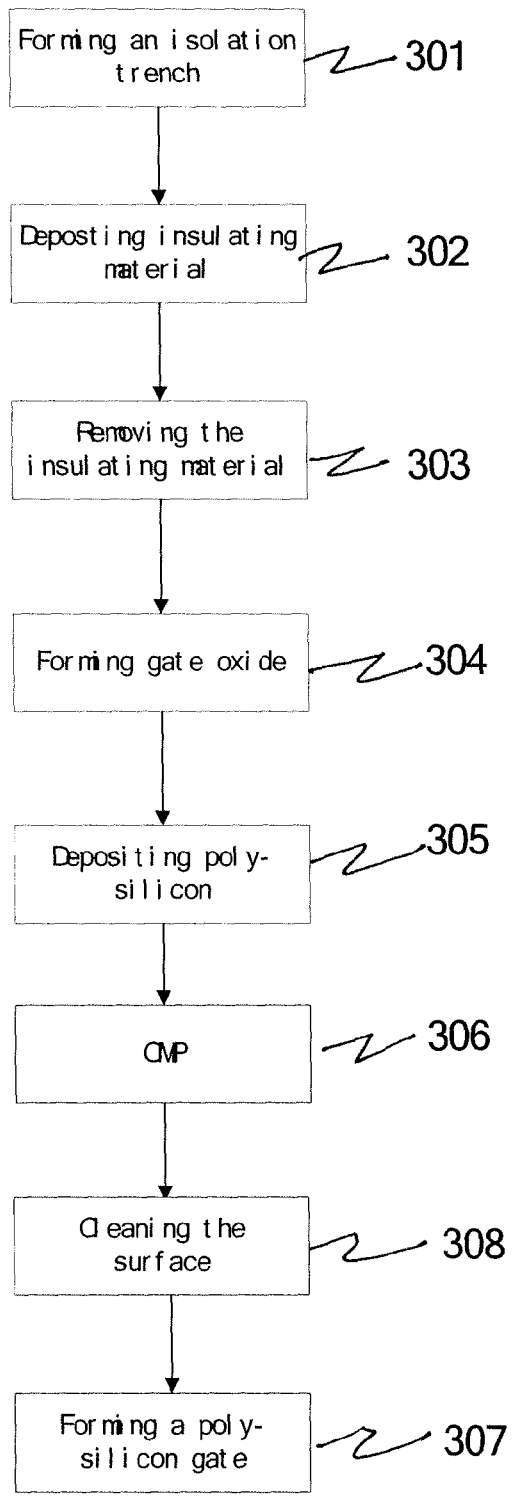
FIG. 3 is a flowchart showing a process for manufacturing a semiconductor device according to one embodiment of the present invention.

FIG. 3 is a flowchart showing a method of manufacturing a semiconductor device according to one embodiment of the present invention.

As shown in FIG. 3, the method comprises the steps of forming an isolation trench in a semiconductor substrate (step 301); depositing a layer of an insulating material over the semiconductor substrate (step 302); removing the insulating material from the surface of the semiconductor substrate with the insulating material being left in the isolation trench (step 303); forming a gate oxide on the semiconductor substrate (step 304); depositing a poly-silicon layer on the gate oxide (step 305); performing chemical mechanical planarization processing on the poly-silicon layer such that the surface of the poly-silicon layer becomes planar (step 306); and, forming a poly-silicon gate with the poly-silicon layer (step 307).

The above steps is described and explained in detail below in conjunction with FIGS. 4A-4F.

FIGS. 4A-4F are diagrams briefly showing a process for manufacturing a semiconductor device incorporating features of the present invention.

Figure 4A:
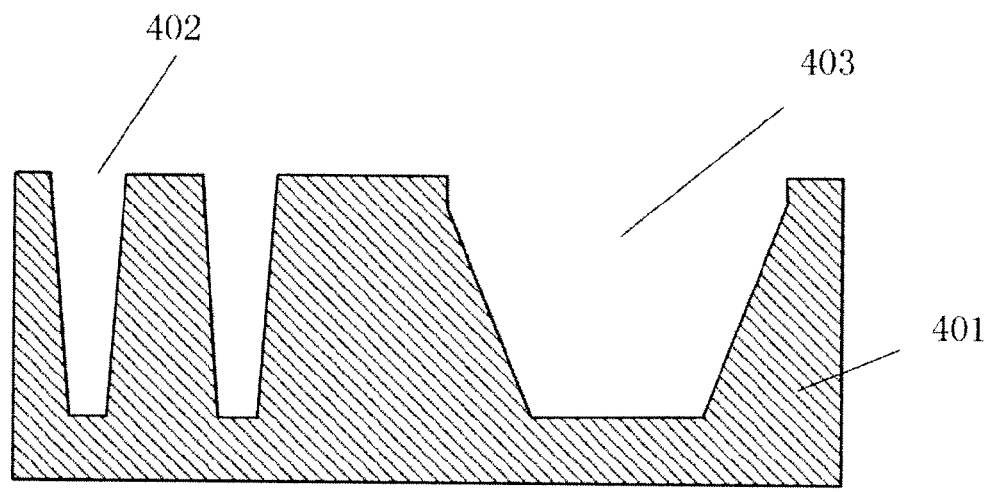
FIGS. 4A-4F are diagrams showing steps in a process for manufacturing a semiconductor device according to one embodiment of the present invention.

First, as shown in FIG. 4A, one or more isolation trenches are formed by selective etching a semiconductor (e.g. Si) substrate 401. According to particular needs of a semiconductor device to be manufactured, the semiconductor substrate 401 is etched to form, for example, a first isolation trench 402 and a second isolation trench 403, wherein, the width of the first isolation trench 402 is smaller than the width of the second isolation trench 403.

A patterned photoresist is used to protect regions of the substrate that do not need to be etched. Regions of the substrate that are not protected by the photoresist are then etched by ion and strong corrosive chemical substances. One of ordinary skill in the art should appreciate that a device such as a dry ion etching machine can be used to form the isolation trench. As shown in FIG. 4A, the inclined sidewalls as well as the smooth bottom of the isolation trench is helpful in improving of the filling quality and the electrical characteristic of the isolation structure, and thus the inclined structure shown in FIG. 4A is a preferred structure.

In addition, in order to protect the surface 405 of the semiconductor substrate 401 during the subsequent chemical mechanical planarization processing (which is described in detail below in conjunction with FIG. 4C), a protection layer such as silicon nitride can be formed on the surface of the semiconductor substrate before the formation of the isolation trench. Silicon nitride is a hard mask material, which can protect the surface of the semiconductor substrate in the subsequent step of filling an insulating material (which is described in detail below in conjunction with FIG. 4B). Moreover, the silicon nitride can serve as a barrier material for the chemical mechanical planarization (CMP) during the CMP processing.

Further, in order to prevent the surface of the semiconductor substrate from being chemically stained when removing the silicon nitride protection layer during the subsequent processing, an isolation oxide layer (e.g. silicon oxide) can be grown or deposited before the formation of the silicon nitride protection layer.

Figure 4B:
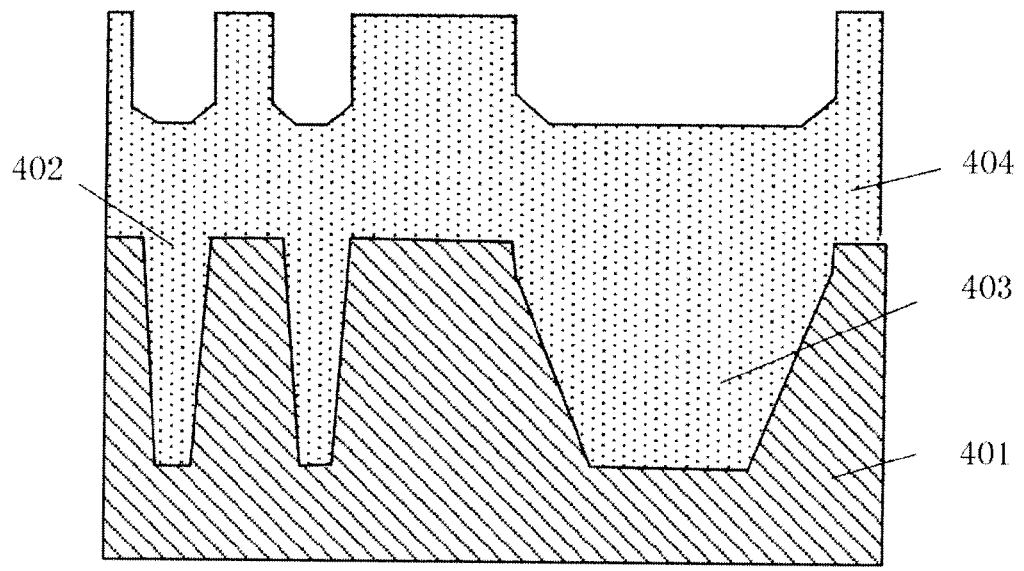

Then, as shown in FIG. 4B, an insulating material 404 is filled into the isolation trench. The insulating material 404 oxides or oxynitrides. The oxide can be silicon oxide and the oxynitrides can be for example silicon oxynitride. The filling of the insulating material 404 can be implemented by using a method such as chemical vapour deposition (CVD) that is well-known in the art. One advantage of using CVD to fill the insulating material 404 is that it can achieve a high output capacity and a high deposition speed.

Figure 4C:
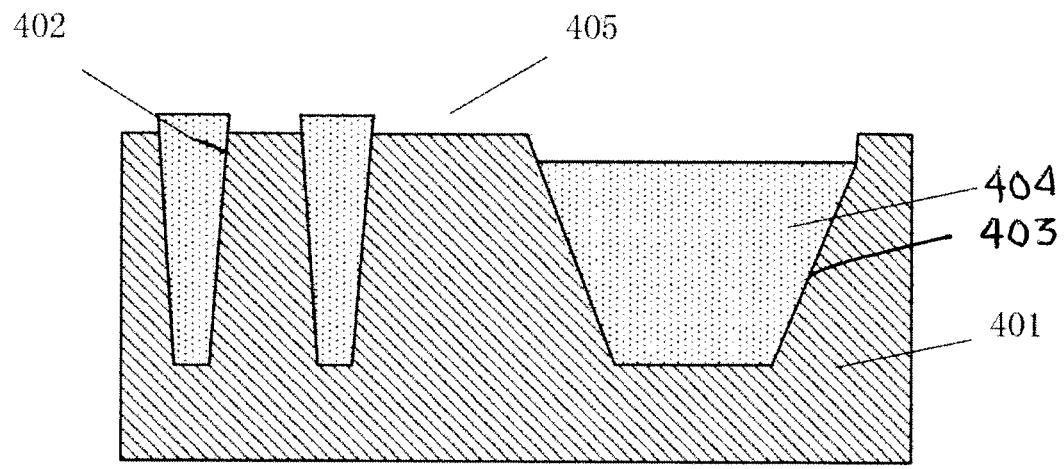

Next, as shown in FIG. 4C, the insulating material 404 is subjected to the chemical mechanical planarization processing and the unnecessary insulating material 404 is removed, such that the surface 405 of the substrate 401 is exposed. However, due to the limitations of the chemical mechanical planarization process, it is not possible to ensure that the surface of the insulating material filled into the respective isolation trench is completely flush with the surface 405 of the substrate 401 such as shown in FIG. 4C. For example, since the first isolation trench 402 is relatively narrow, the surface of the insulating material therein is higher than the surface 405 of the substrate 401. However, because the second isolation trench 403 is relatively wide, the surface of the insulating material 404 therein is lower than the surface 405 of the substrate 401. Currently, the height difference between the surface of the insulating material filled into the isolation trenches and the surface 405 of the substrate 401 can be controlled to be, for example, within a range of −200 Å to +200 Å, by controlling the process of the chemical mechanical planarization.

If a protection layer such as silicon nitride is pre-deposited on the surface of the substrate 401, after being subjected to the CMP processing, the silicon nitride layer that serves as a CMP barrier material still remains on the surface of the substrate 401. Therefore, it is necessary to remove the silicon nitride protection layer after the chemical mechanical planarization processing so as to expose the surface of the substrate 401.

Figure 4D:
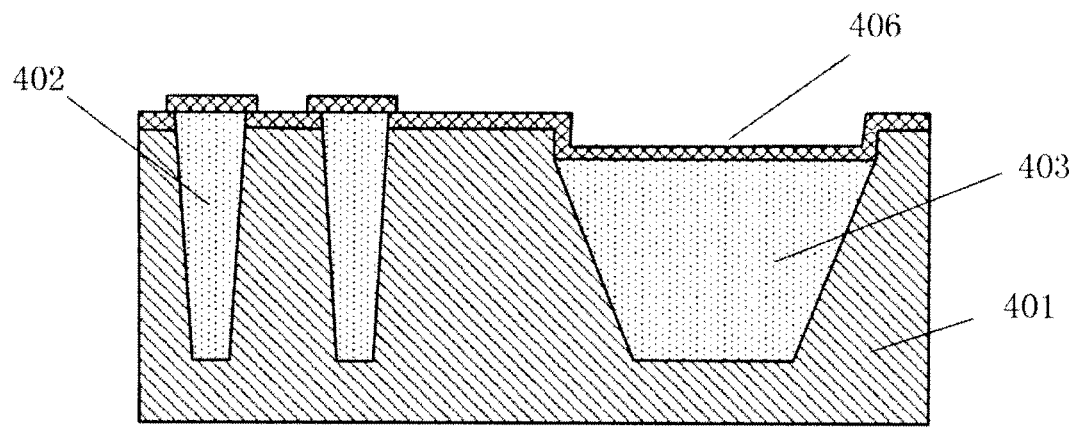

Next, as shown in FIG. 4D, an oxide layer 406 is formed over the entire surface of the substrate. The oxide layer 406 has a thickness preferably ranging from 10 Å to 100 Å. This layer of oxide will serve as a gate oxide. Here, the oxide is preferably silicon oxide.

One of ordinary skill in the art will understand that, if silicon oxide is used as the gate oxide, a silicon substrate can be placed into an oxidization oven for oxidization processing such that the surface of the silicon substrate is oxidized. However, using an oxidation oven, only the surface of the silicon substrate will have an oxide layer formed thereon, while no oxide layer will be formed on the surface of the insulating material in the isolation trenches. Therefore, if it is necessary to fabricate a gate on the isolation trenches in the design of a semiconductor device, a chemical vapour deposition or sputtering method can be employed so as to form an oxide layer on the surfaces of both the substrate 401 and the insulating material at the same time.

Figure 4E:
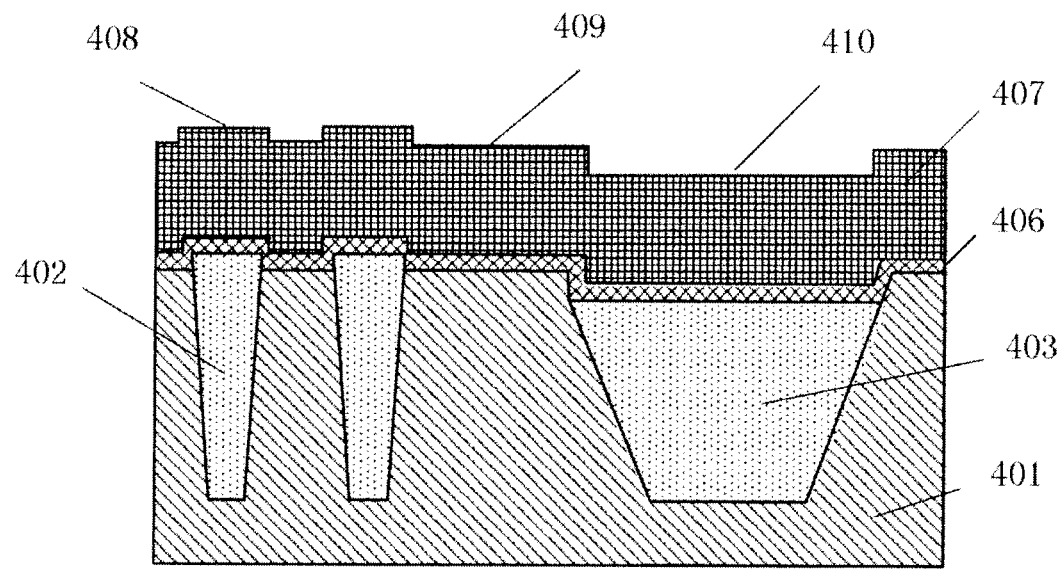

Next, as shown in FIG. 4E, a poly-silicon layer 407 is formed on the oxide layer 406. The poly-silicon layer 407 has a thickness preferably ranging from 500 Å to 1500 Å. Due to the rugged surface topography of the substrate 401, the surface of the poly-silicon layer 407 is also rugged. Here, a first region 408 on the poly-silicon layer 407 that corresponds to the first isolation trench 402 is higher than a third region 409 on the poly-silicon layer 407 that corresponds to the surface of the substrate 401, while a second region 401 on the poly-silicon layer 407 that corresponds to the second isolation trench 403 is lower than the third region 409.

Figure 4F:
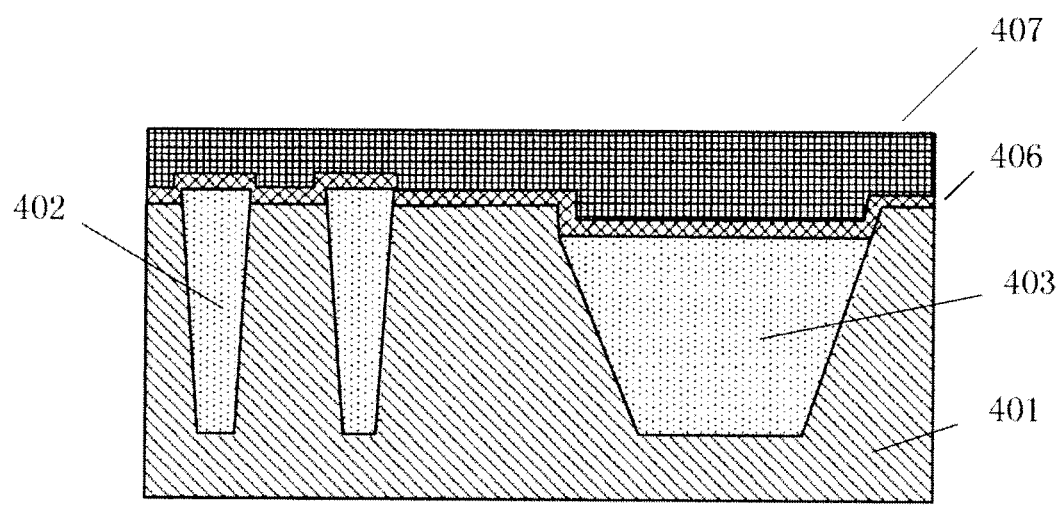

Next, as shown in FIG. 4F, the poly-silicon layer 407 is subjected to a chemical mechanical planarization processing, to cause the surface of the poly-silicon layer 407 to be planar.

Finally, the poly-silicon layer 407 that has been subjected to the CMP processing is used to form a gate.

Based on this embodiment, one of ordinary skill in the art can obtain various semiconductor devices such as CMOS by means of well-known prior art subsequent processing steps. For example, during the fabrication of a semiconductor device with a high-K metal gate, the gate obtained through the above processing is a silicon dummy gate which will be replaced by a metal gate in the subsequent processing.

In the embodiment shown in FIGS. 4A-4F, since the surface of the poly-silicon layer 407 that is used for fabricating a gate becomes planar, the gates obtained from this poly-silicon layer 407 can be maintained at the same height as well. Thus, during the subsequent ILD0 CMP processing process, silicon nitride residues will not occur. Furthermore, with the method incorporating features of the present invention, it is possible to improve the yield and performance of the semiconductor devices, reduce production cost and decrease energy consumption.

One of ordinary skill in the art should understand that, the chemical mechanical planarization processing of the poly-silicon layer 407, can be performed by using a chemical mechanical planarization device and various known methods.

The chemical mechanical planarization device typically includes a grinding head, a rotating platen and a polishing pad. The substrate to be ground is mounted into the grinding head while the polishing pad is provided on the rotating platen and rotates with respect to the grinding head as a result of the rotating platen. A grinding material is provided between the grinding head and the polishing pad, while an appropriate down force is applied, thereby grinding the substrate.

Figure 5:
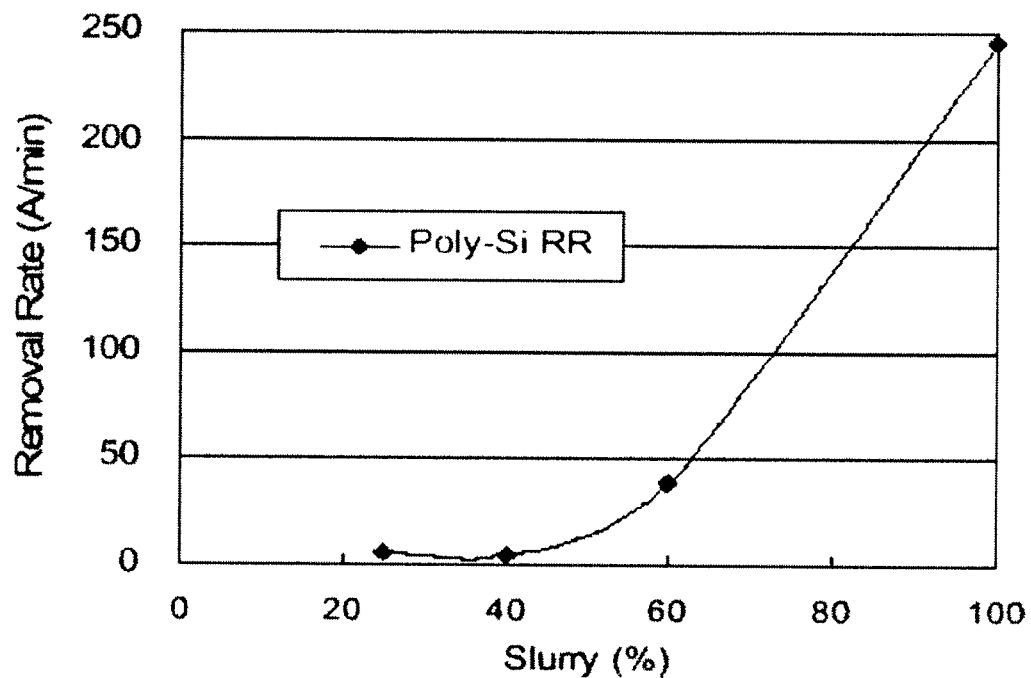
FIG. 5 is a graph showing the relationship between the slurry concentration and the removal rate.

As a preferred embodiment, the down force of the grinding head is maintained between 1 psi and 3 psi. Alternatively, the rotating speed of the rotating platen is from 50 rpm to 110 rpm. A more preferred solution is to combine the above two preferred embodiments. That is, the down force of the grinding head is maintained between 1 psi and 3 psi and the rotating speed of the rotating platen is from 50 rpm to 110 rpm. For the grinding of poly-silicon, it is preferable to use a cerium oxide ($CeO_2$) based slurry. One advantage of using $CeO_2$ based slurry is that, when the surface of the poly-silicon layer 407 becomes planar, grinding can automatically stop. Different slurry dilution ratios can have a different self stopping performance. FIG. 5 shows a graph illustrating the relationship between the removal rate of the poly-silicon and the slurry concentration used for grinding (cerium oxide). As shown in FIG. 5, when the mass percentage of the slurry is less than 40% (that is, a de-ionized water to slurry ratio >1.5:1), a good self stop performance can be obtained.

In addition, since the chemical mechanical planarization processing will inevitably cause the substrate surface contaminated, cleaning the substrate surface to become after the chemical mechanical planarization processing is also a very importance step. By cleaning, impurities, like the slurry remaining on the substrate surface, can be removed, thereby providing a clean substrate.

In the embodiment where $CeO_2$ based slurry is employed, the slurry exhibits a positive surface charge, and thus it will attract surfactants (negative ions).

Table 1 below shows the electrical property of the surface charge of the $CeO_2$ abrasive and the electrical property of the surface of the poly-silicon when cerium oxide slurry with or without a surfactant is used.

TABLE 1

| Film/Abrasive | Cerium Oxide Slurry (PH = 5.1) |
|---|---|
| $CeO_2$ abrasive(IEP = 6.8) | + |
| $CeO_2$ abrasive with surfactant | − |
| Poly-silicon Film (IEP = 9.8) | + |

Table 1 also lists the IsoElectric Points (IEP) for the $CeO_2$ abrasive and the poly-silicon film. The electrical property of the surface charges carried by the $CeO_2$ abrasive and the poly-silicon film varies with a change of the pH value of the solution. When the pH value of the solution is larger than the IsoElectric Point, the surface charges carried thereby are negative; when the pH value of the solution is smaller than the IsoElectric Point, the surface charge carried thereby is positive.

Specifically speaking, in regard to, cerium oxide slurry, it has a pH value of 5.1 which is less than the IEP value of the poly-silicon film, and thus the surface of the poly-silicon film carries positive charges. The $CeO_2$ abrasive has an IEP value of 6.8 which is also larger than the PH value of the slurry, and thus the surface of the $CeO_2$ abrasive likewise carries positive charges. However, when the surface of the $CeO_2$ abrasive has a surfactant (negative ions) adsorbed thereto, the $CeO_2$ abrasive and the adsorbed surfactant together exhibit negative charges. This situation has unfavourable effects on the cleaning process used after chemical mechanical planarization because the positive poly-silicon surface and the negative $CeO_2$ abrasive will attract each other such that an increased amount of abrasive remains on the substrate surface. In order to examine abrasive materials remaining on the substrate surface, the substrate surface that was cleaned by a conventional cleaning manner was scanned using a surface defect detecting device.

Figures 6A, 6B:
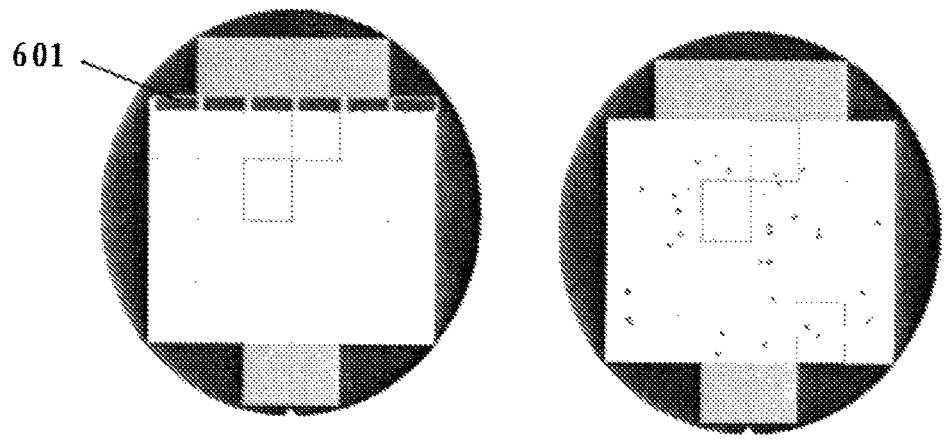
FIG. 6A and FIG. 6B are diagrams showing the surface of the substrate cleaned using prior art techniques and after cleaning using the procedure described herein.

The surface defect detecting device is configured to automatically stop the scanning once 2000 defects have been detected. FIGS. 6A and 6B show a magnified image of the wafer after cleaning. The difference is that the wafer in FIG. 6A was cleaned using prior art techniques, and the wafer in FIG. 6B was cleaned using the process described herein. The material on the surface detected during the scan are shown as the black dots in the images. The wafer surface is shown as divided into a plurality of sectors that are formed during the fabrication of the semiconductor devices. When the semiconductor devices are fabricated, the surface of the wafer is exposed (i.e. the semiconductor devices are fabricated thereon) sector by sector with many dies in each sector. In FIG. 6A the upper portion 601 of the upper row of sectors shows such a large amount of material that the scan automatically terminated once a maximum allowable count was obtained. In contrast, FIG. 6B has far fewer surface material and therefore a complete scan was able to be obtained. The scanning results in FIG. 6A, show that the surface defect detecting device only scanned a small region 601 because a predetermined number of 2000 defects had already been reached causing the scan to be terminated. This indicates that, after the conventional cleaning processing, there is still a lot of $CeO_2$ abrasives (black dots in the figure) remaining on the substrate surface. Based on a rough estimation, the number of defects on the substrate surface is larger than 3000 ea/psc.

One of ordinary skill in the art will understand that, most of the defects detected in this situation are abrasive material remaining on the substrate surface.

In view of this, an alkaline solution is used for cleaning the substrate surface that has been subjected to the chemical mechanical planarization processing. The alkaline solution is, preferably an ammonia solution, hydrogen peroxide solution, or a mixed solution (SC1) of both. One of ordinary skill in the art will appreciate that, during the preparation of the above solutions, it is necessary to add a proper amount of de-ionized water.

By adding an alkaline solution (e.g. a mixed solution of ammonia and hydrogen peroxide solution), the pH value for the substrate surface environment is increased to be between 6.8 and 9.8. In this way, the $CeO_2$ abrasive will carry negative charges. However, since the $CeO_2$ abrasive will adsorb positive ions, it may exhibit a positive surface. The poly-silicon layer still carries positive charges because the pH value for the substrate surface is still lower than the IEP value of the poly-silicon film. Because like charges repel each other, it is much easier to wash the remaining $CeO_2$ abrasives off the surface of the poly-silicon film.

In another embodiment, a better cleaning effect is achieved by using a cleaning solution of a mixed solution of ammonia solution and hydrogen peroxide solution having a temperature higher than 60° C. Typically, in the mixed solution, the volume ratio for the ammonia solution, the hydrogen peroxide solution and the de-ionized water is 1:1:40-1:3:100. In a more preferred composition, the volume ratio for the ammonia solution, the hydrogen peroxide solution and the de-ionized water is 1:2:50. Generally, the mass concentration of the ammonia solution that is used for preparing the cleaning solution is 29% and the mass concentration of the hydrogen peroxide solution is 30%. One of ordinary skill in the art based on the teaching herein can select other suitable concentrations for the ammonia solution and the hydrogen solution as needed.

In a further embodiment, ultrasonic energy is applied to the substrate surface while using a mixed solution of ammonia solution and hydrogen peroxide solution having a temperature higher than 60° C. as a cleaning solution. This ultrasonic processing is generally a frequency range of, 20 KHz-100 KHz, and a power range which is controlled to be between 80 W and 500 W. FIG. 6B shows a result obtained after cleaning the substrate using the method of this embodiment. The surface defect detecting device is configured to automatically stop scanning when 2000 defects have been detected. In the scanning results shown in FIG. 6B, scanning of the entire substrate surface is completed; the number of the detected defects does not reach the predetermined cut off number of 2000. Using the cleaning method according to the above embodiment, $CeO_2$ abrasive remaining on the substrate surface based on a rough estimate is reduced to about 9 ea/psc.

The method of manufacturing a semiconductor device according to the present invention as well as the semiconductor device formed thereby has been described in detail. In order not to obscure the concepts of the present invention, some details known in the art have not been described. One of ordinary skill in the art based on the teachings herein can understand how to implement the technical solution disclosed.

Although some specific embodiments of the present invention have been demonstrated in detail with examples, it should be understood by a person skilled in the art that the above examples are only intended to be illustrative but not to limit the scope of the present invention. It should be understood by a person skilled in the art that the above embodi-

What is claimed is:

1. A method of manufacturing a semiconductor device, comprising the steps of:
   forming an isolation trench in a semiconductor substrate;
   depositing a layer of an insulating material on the semiconductor substrate;
   removing the insulating material from the semiconductor substrate, the insulating material remaining in the isolation trench;
   forming a gate oxide on the semiconductor substrate;
   depositing a poly-silicon layer on said gate oxide;
   causing said silicon layer to become planar by performing a chemical mechanical planarization processing on said poly-silicon layer, comprising applying a grinding head having a down force of from about 1 psi to about 3 psi, and a rotating platen having a rotating speed of from 50 rpm to 110 rpm, using a $CeO_2$ based slurry for grinding having a mass concentration of less than 40% $CeO_2$;
   cleaning the surface of said poly-silicon layer; and
   forming a poly-silicon gate with said poly-silicon layer, wherein said cleaning comprises:
      cleaning the surface of said poly-silicon layer using an alkaline solution having a temperature higher than 60 degrees centigrade, thereby removing particles remaining on the surface of said poly-silicon layer.

2. The method according to claim 1, wherein said insulating material is an oxide or an oxynitride.

3. The method according to claim 1, wherein said insulating material is silicon oxide.

4. The method according to claim 1, wherein said insulating material is silicon oxynitride.

5. The method according to claim 1, wherein said isolation trench is a shallow isolation trench.

6. The method according to claim 1, further comprising a step of defining an active area in said substrate by ion implantation.

7. The method according to claim 1, wherein said alkaline solution has a PH value between 6.8 and 9.8.

8. The method according to claim 1, wherein said alkaline solution is a mixed solution of ammonia solution, hydrogen peroxide solution and de-ionized water.

9. The method according to claim 8, wherein the volume ratio for the ammonia solution, the hydrogen peroxide solution and the de-ionized water is 1:1:40-1:3:100.

10. The method according to claim 8, wherein the volume ratio for the ammonia solution, the hydrogen peroxide solution and the de-ionized water is 1:2:50.

11. The method according to claim 8, wherein the ammonia solution has a mass concentration of 29%.

12. The method according to claim 8, wherein the hydrogen peroxide solution has a mass concentration of 30%.

13. The method according to claim 1, further comprising: applying ultrasonic energy to the surface of said poly-silicon layer while cleaning.

14. The method according to claim 13, wherein said ultrasonic energy has a power ranging from 80 W to 500 W.

15. The method according to claim 13, wherein said ultrasonic energy has a frequency ranging from 20 KHz to 100 KHz.

16. The method according to claim 1, wherein said slurry contains about 23% to about 40% $CeO_2$.

* * * * *